United States Patent
Dai et al.

(10) Patent No.: US 6,869,857 B2
(45) Date of Patent: Mar. 22, 2005

(54) METHOD TO ACHIEVE STI PLANARIZATION

(75) Inventors: Feng Dai, San Jose, CA (US); Pang Choong Hau, Singapore (SG); Peter Hing, Singapore (SG); Lap Chan, San Francisco, CA (US)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 109 days.

(21) Appl. No.: 10/002,987

(22) Filed: Nov. 30, 2001

(65) Prior Publication Data

US 2003/0104676 A1  Jun. 5, 2003

(51) Int. Cl.⁷ .............................................. H01L 21/76
(52) U.S. Cl. ........................ 438/427; 438/296; 438/692
(58) Field of Search ................................ 438/296, 404, 438/424, 690, 691, 694, 697, 699, 700

(56) References Cited

U.S. PATENT DOCUMENTS

| | | | |
|---|---|---|---|
| 4,954,459 A | 9/1990 | Avanzino et al. | 437/228 |
| 5,923,993 A | 7/1999 | Sahota | 438/427 |
| 5,961,794 A | 10/1999 | Morita | 204/192.34 |
| 6,004,863 A * | 12/1999 | Jang | 438/427 |
| 6,015,755 A | 1/2000 | Chen et al. | 438/692 |
| 6,037,018 A * | 3/2000 | Jang et al. | 427/579 |
| 6,057,207 A | 5/2000 | Lin et al. | 438/424 |
| 6,057,210 A | 5/2000 | Yang et al. | 438/427 |
| 6,103,581 A | 8/2000 | Lin et al. | 438/296 |
| 6,197,691 B1 | 3/2001 | Lee | 438/691 |
| 6,403,483 B1 * | 6/2002 | Hao et al. | 438/692 |
| 6,403,484 B1 * | 6/2002 | Lim et al. | 438/692 |
| 6,426,272 B1 * | 7/2002 | Fu et al. | 438/435 |
| 6,559,026 B1 * | 5/2003 | Rossman et al. | 438/424 |

OTHER PUBLICATIONS

U.S. Appl. No. 09/803,187, filed Mar. 12, 2001, Keong et al.

* cited by examiner

Primary Examiner—Amir Zarabian
Assistant Examiner—Pamela E Perkins
(74) Attorney, Agent, or Firm—George D. Saile; Rose Mary L.S. Pike

(57) ABSTRACT

A new method of forming shallow trench isolations without using CMP is described. A plurality of isolation trenches are etched through an etch stop layer into the semiconductor substrate leaving narrow and wide active areas between the trenches. An oxide layer is deposited over the etch stop layer and within the trenches using a high density plasma chemical vapor deposition process (HDP-CVD) having a deposition component and a sputtering component wherein after the oxide layer fills the trenches, the deposition component is discontinued while continuing the sputtering component until the oxide layer is at a desired depth. In one method, the oxide layer overlying the etch stop layer in the wide active areas is etched away. The etch stop layer and oxide layer residues are removed to complete planarized STI regions. In another method, a second etch stop layer is deposited over the oxide layer using a HDP-CVD process whereby the second etch stop layer is sputtered away over the oxide layer overlying the first etch stop layer in the narrow active areas and whereby the second etch stop layer remains in the wide active areas. The second etch stop layer over the oxide layer in the wide active areas is etched away. The oxide layer overlying the first etch stop layer in the narrow and wide active areas is etched away. The first and second etch stop layers are removed to complete STI regions.

25 Claims, 7 Drawing Sheets

METHOD TO ACHIEVE STI PLANARIZATION

BACKGROUND OF THE INVENTION (1) Field of the Invention

The invention relates to a method of fabricating semiconductor structures, and more particularly, to a method of forming planarized shallow trench isolation structures in the manufacture of integrated circuit devices.

(2) Description of the Prior Art

Shallow trench isolation (STI) is now commonly used in the art as an alternative to local oxidation of silicon (LOCOS) for forming isolations between active device areas in the integrated circuit. STI offers the advantages of smaller isolation area and better surface planarization when compared to LOCOS. However, the STI process suffers from dishing, especially over large trenches. Dishing can cause excessive device leakage in some cases. Currently, reverse masking, dummy active areas, and a newer nitride cap are the most commonly employed methods to prevent dishing during the STI chemical mechanical polishing (CMP) process. Unfortunately, these processes are expensive and time consuming. Furthermore, CMP is a "dirty" process that needs many subsequent cleaning steps. If CMP could be eliminated, many trench isolation problems could be solved.

Co-pending U.S. patent application Ser. No. 09/439,357 (CS-99-059) to James Lee, filed on Nov. 15, 1999, now U.S. Pat. No. 6,197,691, teaches a new technique for preventing dishing in an STI process. This process requires an additional HF dip step. Co-pending U.S. patent application Ser. No. 09/803,187 (CS-00-138) to V. L. S. Keong et al, filed on Mar. 12, 2001, is an improvement over U.S. Pat. No. 6,197,691 where the HF dip step is not required. Several prior art approaches disclose methods to form and planarize shallow trench isolations. U.S. Pat. No. 6,057,210 to Yang et al shows a process in which corners of the silicon nitride areas are exposed using a wet etch. U.S. Pat. No. 6,015,755 to Chen et al shows a partial reverse mask process in which a reverse mask is formed over wide areas. CMP or etchback is used. U.S. Pat. Nos. 4,954,459 to Avanzino et al and 5,961,794 to Morita teach reverse mask processes. U.S. Pat. Nos. 5,923,993 to Sahota, 6,057,207 to Lin et al, and 6,103,581 to Lin et al teach CMP processes. U.S. Pat. No. 6,004,863 discloses isotropic etching of oxide peaks.

SUMMARY OF THE INVENTION

A principal object of the present invention is to provide an effective and very manufacturable method of fabricating shallow trench isolations in the manufacture of integrated circuits.

A further object of the present invention is to provide a method to fabricate planarized shallow trench isolations.

Another object of the present invention is to provide a method to fabricate planarized shallow trench isolations without using chemical mechanical polishing (CMP).

Yet another object of the invention is to provide a method to fabricate planarized shallow trench isolations without using CMP and without using dummy active areas.

In accordance with the objects of this invention, a new method of forming shallow trench isolations without using CMP is achieved. An etch stop layer is deposited on the surface of a semiconductor substrate. A plurality of isolation trenches are etched through the etch stop layer into the semiconductor substrate whereby narrow active areas and wide active areas are left between the isolation trenches. An oxide layer is deposited over the etch stop layer and within the isolation trenches using a high density plasma chemical vapor deposition process (HDP-CVD) having a deposition component and a sputtering component wherein after the oxide layer fills the isolation trenches, the deposition component is discontinued while continuing the sputtering component until the oxide layer is at a desired depth in the isolation trenches whereby the oxide layer within the isolation trenches is disconnected from the oxide layer overlying the etch stop layer. The oxide layer overlying the etch stop layer in the wide active areas is etched away wherein oxide layer residues are left overlying the etch stop layer. The etch stop layer and the oxide layer residues are removed to complete planarized shallow trench isolation regions in the manufacture of an integrated circuit device.

Also in accordance with the objects of this invention, another method of forming shallow trench isolations without using CMP is achieved. A pad oxide layer is grown on the surface of a semiconductor substrate. A first etch stop layer is deposited over the pad oxide layer. A plurality of isolation trenches are etched through the first etch stop layer and the pad oxide layer into the semiconductor substrate whereby narrow active areas and wide active areas are left between the isolation trenches. An oxide layer is deposited over the first etch stop layer and within the isolation trenches using a high density plasma chemical vapor deposition process (HDP-CVD) having a deposition component and a sputtering component wherein after the oxide layer fills the isolation trenches, the deposition component is discontinued while continuing the sputtering component until the oxide layer is sputtered back within the isolation trenches to the level of the pad oxide layer. A second etch stop layer is deposited over the oxide layer using a high density plasma chemical vapor deposition process (HDP-CVD) having a deposition component and a sputtering component whereby the second etch stop layer is sputtered away overlying the oxide layer overlying the first etch stop layer in the narrow active areas and whereby the second etch stop layer remains overlying the oxide layer overlying the first etch stop layer in the wide active areas. The second etch stop layer overlying the oxide layer in the wide active areas is etched away. Then the oxide layer overlying the first etch stop layer in the narrow and wide active areas is etched away. The first and second etch stop layers are removed to complete planarized shallow trench isolation regions in the manufacture of an integrated circuit device.

BRIEF DESCRIPTION OF THE DRAWINGS

In the accompanying drawings forming a material part of this description, there is shown.

DESCRIPTION OF THE PREFERRED EMBODIMENTS

The present invention is an improvement over U.S. Pat. No. 6,197,691 to James Lee and the co-pending application Ser. No. 09/803/87 (CS-00-138) to V. L. S. Keong et al. The present invention achieves the prevention of oxide dishing and uniformity control of the oxide thickness as do the patent and co-pending application. However, the present invention offers the further advantage of eliminating the "dirty" CMP process. A first preferred embodiment of the present invention will be described with reference to FIGS. 1 through 7. A second preferred embodiment of the present invention will be described with reference to FIGS. 8 through 14.

Figure 1:
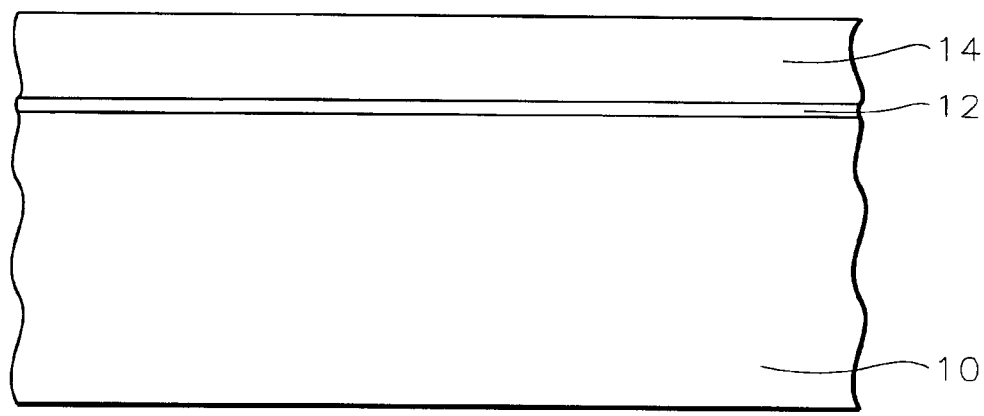
FIGS. 1 through 7 schematically illustrate in cross-sectional representation a first preferred embodiment of the present invention.

Referring now more particularly to FIG. 1, there is shown a cross section of a partially completed integrated circuit device of the first preferred embodiment. A semiconductor substrate 10, typically consisting of monocrystalline silicon, is provided. A pad silicon dioxide layer 12 is thermally grown over the substrate surface to a thickness of between about 80 and 120 Angstroms. A first etch stop layer 14 is deposited overlying the semiconductor substrate 10. The first etch stop layer 14 acts as a stop for the subsequent etching of the gap fill layer. The first etch stop layer 14 is preferably comprised of silicon nitride and is deposited by low-pressure chemical vapor deposition (LPCVD). The first etch stop layer 14 is deposited to a thickness of between about 1500 and 2500 Angstroms.

Figure 2:
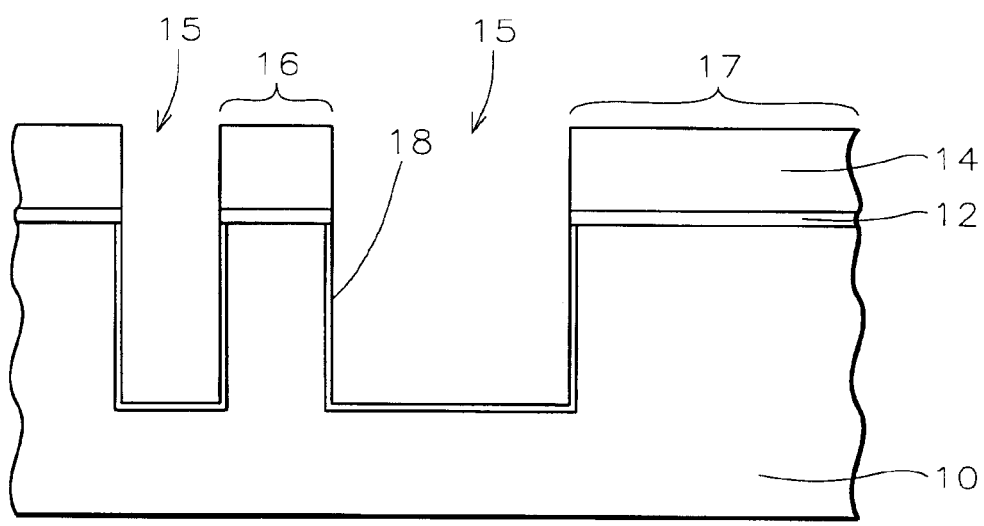

Referring now to FIG. 2, the first etch stop layer 14 and the semiconductor substrate 10 are etched to form trenches 15 for planned shallow trench isolations that define wide and narrow active areas. For example, narrow active area 16 has a width of less than about 0.3 $\mu$m while wide active area 17 has a width of greater than about 100 $\mu$m. The trenches are etched using a conventional etching process such as reactive ion etching (RIE). A liner oxide layer 18 is grown within the trenches 15 to a thickness of about 100 Angstroms.

Figure 3:
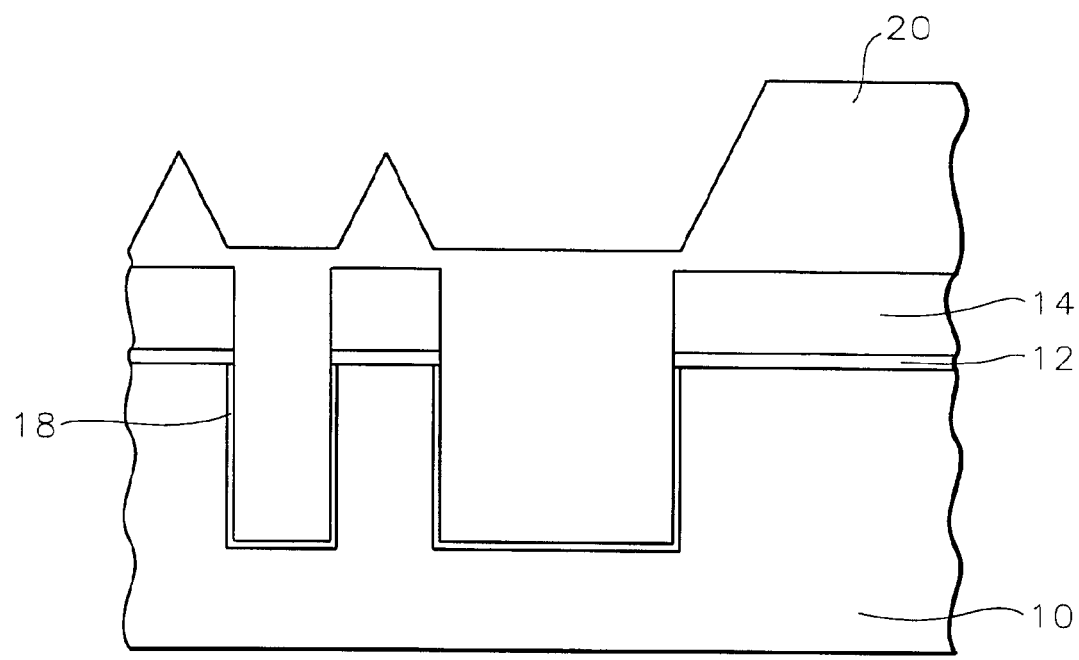

Referring now to FIG. 3, a gap fill layer 20 of high density plasma (HDP) oxide is deposited overlying the first etch stop layer 14 and filling the trenches. HDP oxide is used because of the excellent gap filling properties of this process. In an HDP plasma process, the silicon dioxide material is deposited and etched simultaneously in the same reaction. This process causes the silicon dioxide to be deposited very densely and with no voids. In addition, the etching process causes the HDP oxide to assume the near 45 degree angle profile at trench corners as shown in the illustration. In addition, a densification step may be performed.

Figure 4:
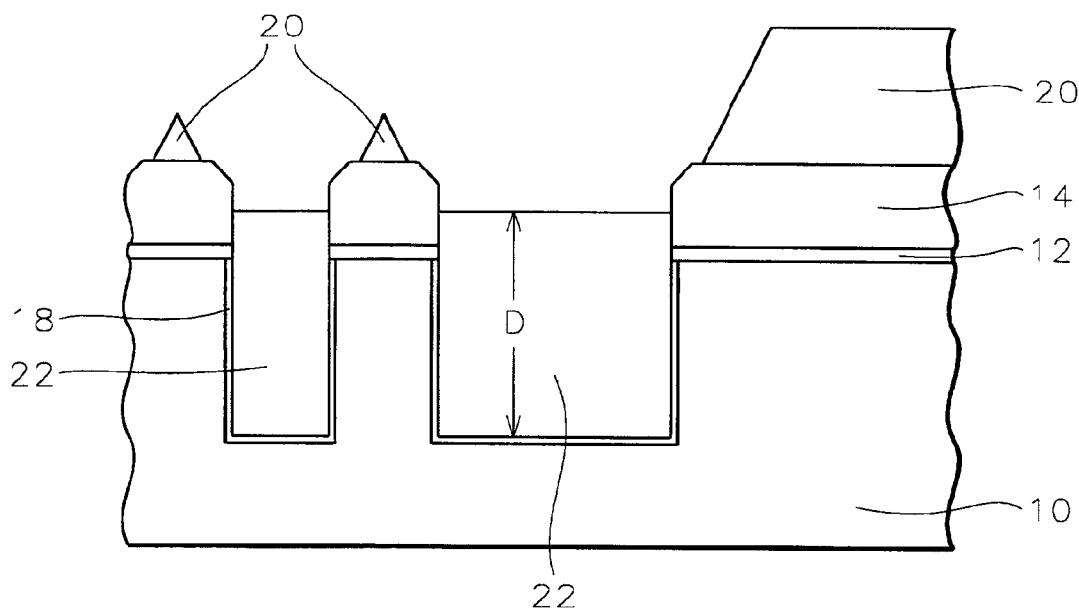

After the correct amount of HDP oxide is deposited to fill the trenches, the deposition component of the HDP process is turned off, but the Argon ion sputtering component is continued. Under sputtering, the horizontal dimension reduces much faster than the vertical dimension. The selectivity between the slope of the oxide to the planar surface is approximately 5–10:1. Sputtering is continued until the desired depth D of the final oxide is reached, as shown in FIG. 4. Notice that this sputtering step breaks the connection between the oxide 22 within the trenches and the oxide 20 overlying the etch stop layer 14. The deposition and sputter-back step just described are performed in-situ, as one step in the HDP chemical vapor deposition (CVD) process.

Figure 5:
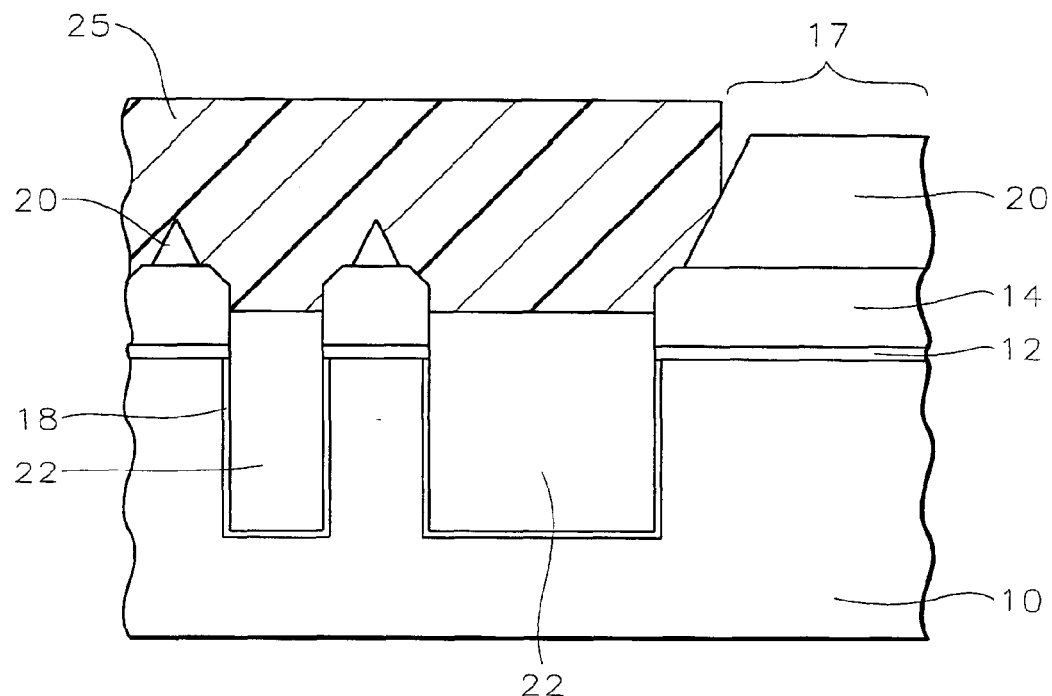
Figure 6:
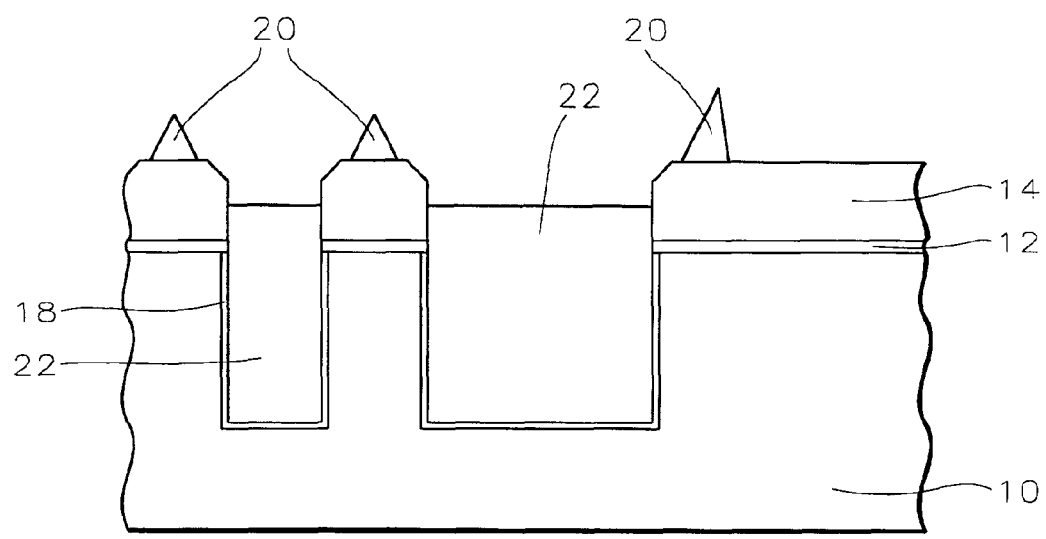

Referring now to FIG. 5, a reverse mask 25 is formed over the substrate exposing the large active areas 17. The reverse mask has an over-bias. Now, the oxide layer 20 is etched away over the large active areas 17 where it is not covered by the mask 25, using the etch stop layer 14 as the etch stop. After removing the mask 25, most of the etch stop layer 14 is exposed, as shown in FIG. 6. Residue of the oxide 20 remains on top of the etch stop layer 14.

Figure 7:
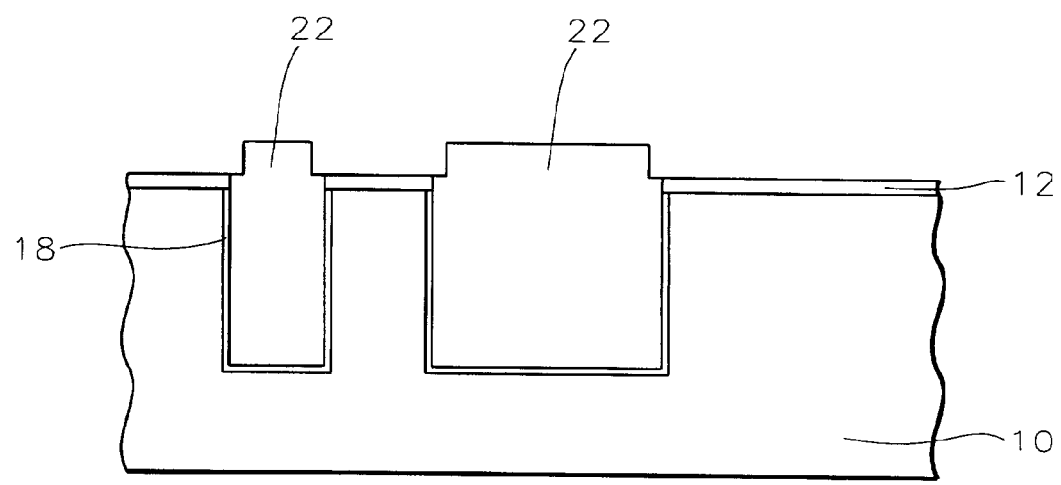

Now, the etch stop layer 14 is removed by stripping with phosphoric acid, for example. This etch stop layer removal will also remove the oxide residues 20 overlying the etch stop layer. As an alternative, the residue oxide 20 could first be removed by etching selective to the etch stop layer before stripping the etch stop layer. FIG. 7 illustrates the final planarity of the shallow trench isolation regions 22, showing good global uniformity without dishing. Significantly, this good global planarity was achieved without chemical mechanical polishing, thus saving many cleaning process steps and saving costs.

Figure 8:
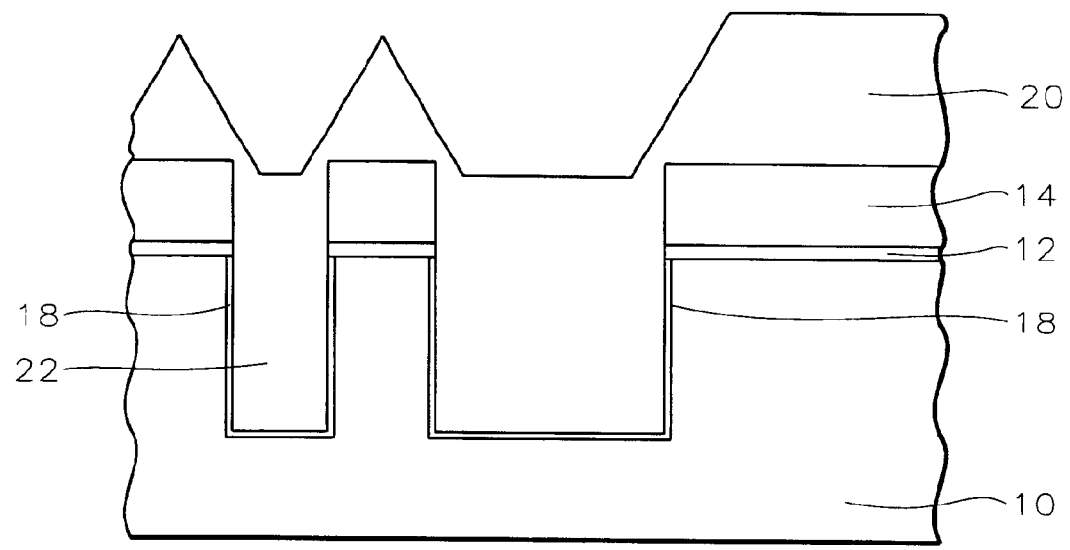
FIGS. 8 through 14 schematically illustrate in cross-sectional representation a second preferred embodiment of the present invention.

A second preferred embodiment of the present invention will be described with reference to FIGS. 8 through 12. The second embodiment of the invention is the same as the first embodiment through the steps shown in FIG. 2. Referring now to FIG. 8, a gap fill layer 20 of high density plasma (HDP) oxide is deposited overlying the first etch stop layer 14 and filling the trenches. HDP oxide is used because of the excellent gap filling properties of this process. In an HDP plasma process, the silicon dioxide material is deposited and etched simultaneously in the same reaction. This process causes the silicon dioxide to be deposited very densely and with no voids. In addition, the etching process causes the HDP oxide to assume the near 45 degree angle profile at trench corners as shown in the illustration. In addition, a densification step is performed. A deposition to sputter ratio of about 3.6, +/− 20%, is used to fill the trenches.

Figure 9:
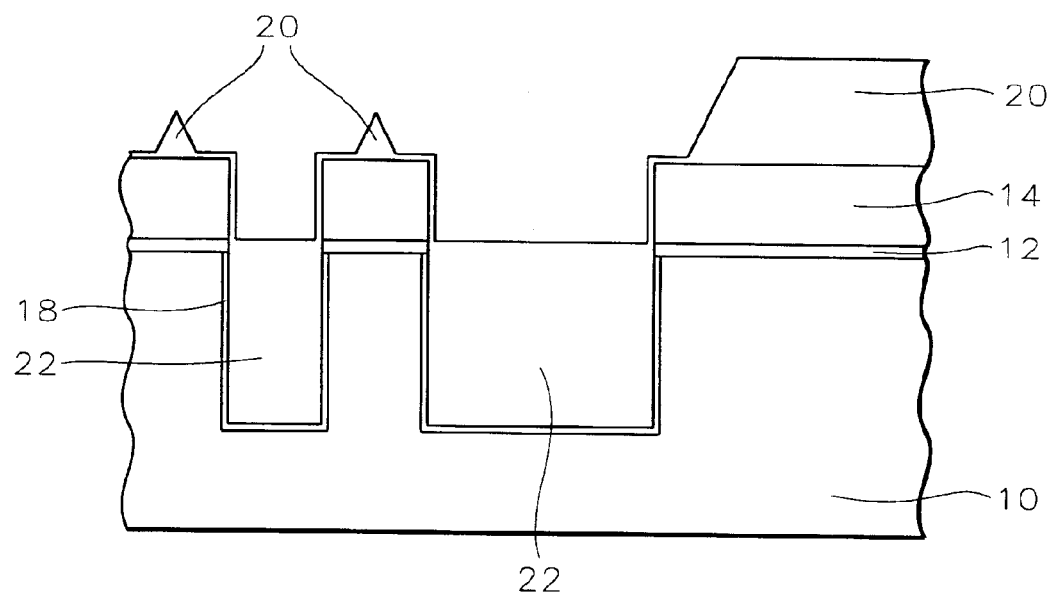

After the correct amount of HDP oxide is deposited to fill the trenches, the deposition component of the HDP process is turned off, but the Argon ion sputtering component is continued. Under sputtering, the horizontal dimension reduces much faster than the vertical dimension. Sputtering is continued until the oxide is etched back to about the level of the pad oxide layer 12, as shown in FIG. 9. Notice that in this embodiment, the sputtering step is shorter than in the first embodiment so that it does not break the connection between the oxide within the trenches and the oxide overlying the etch stop layer 14. The deposition and sputter-back step just described are performed in-situ, as one step, in the HDP chemical vapor deposition (CVD) process.

Figure 10:
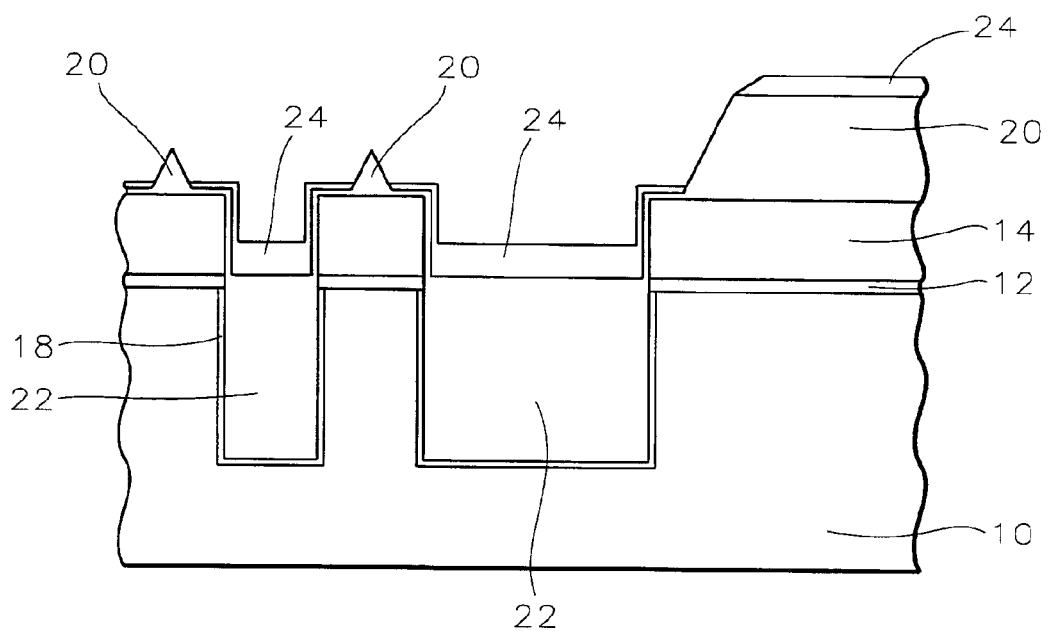

Referring now to FIG. 10, a second etch stop layer 24 is deposited overlying the HDP oxide layer 20. The second etch stop layer 24 comprises silicon nitride deposited using HDP-CVD with a deposition to sputtering ratio of about 2, +/− 20%. The HDP-CVD silicon nitride 24 is deposited onto the HDP-CVD oxide layer 20 to a thickness of between about 500 and 2000 Angstroms. The silicon nitride on the sidewall of the oxide 20 above the trenches is removed by this sputtering step.

Figure 11:
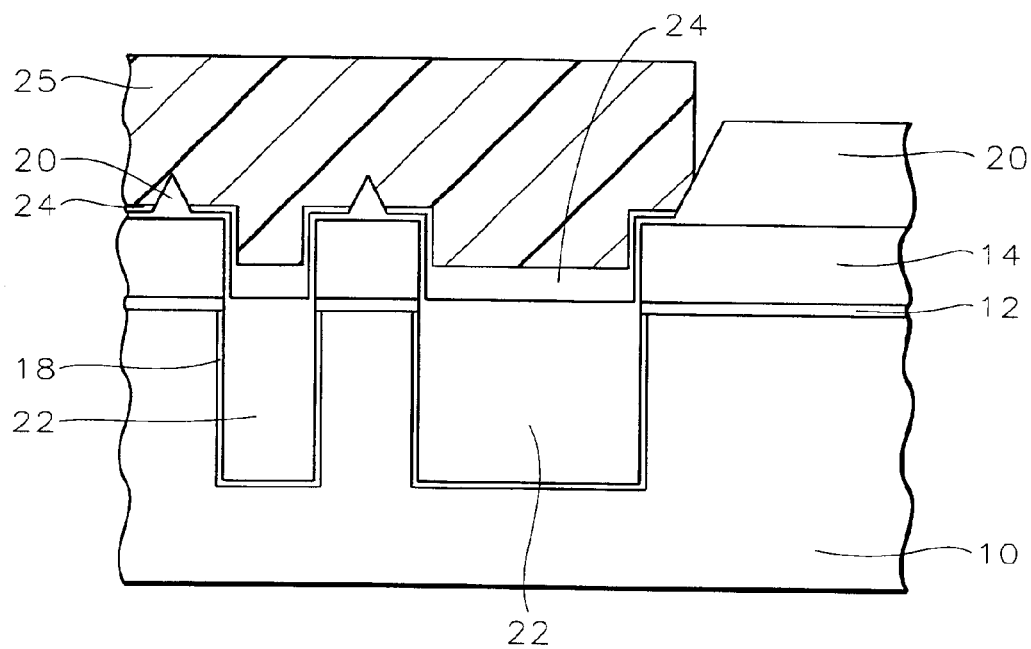
Figure 12:
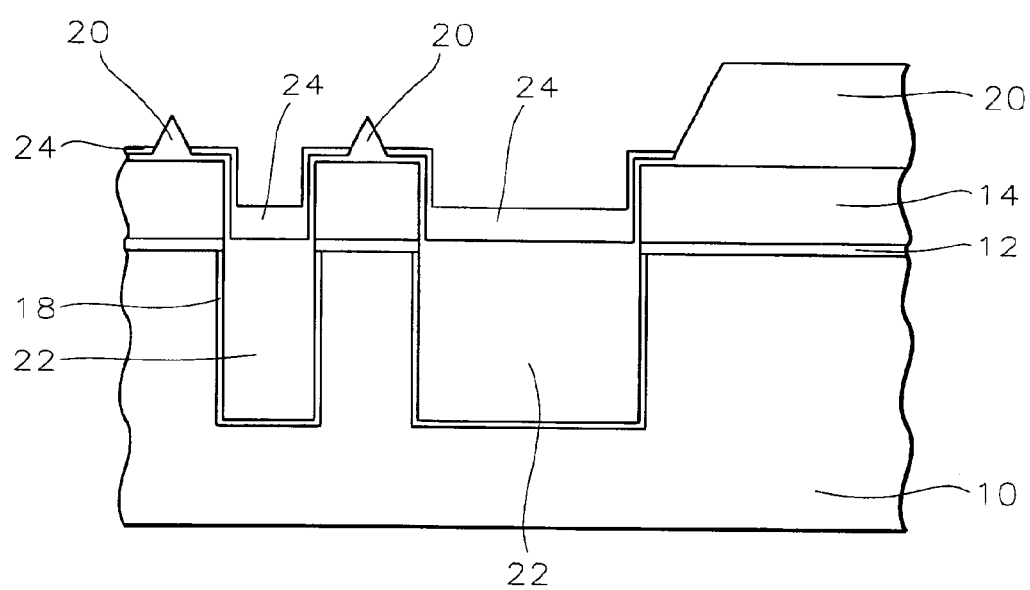

Referring now to FIG. 11, a reverse mask 25 is formed over the substrate exposing the large active areas 17. Now, the silicon nitride layer 24 is etched away over the large active areas where it is not covered by the mask 25, using the oxide layer 20 as the etch stop. After etching, the mask 25 is removed, as shown in FIG. 12.

Figure 13:
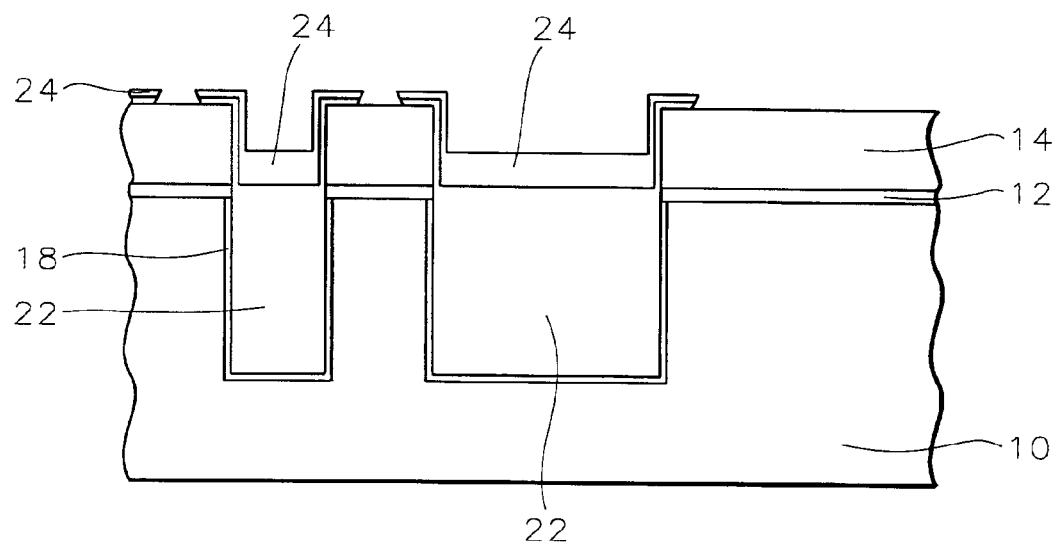
Figure 14:
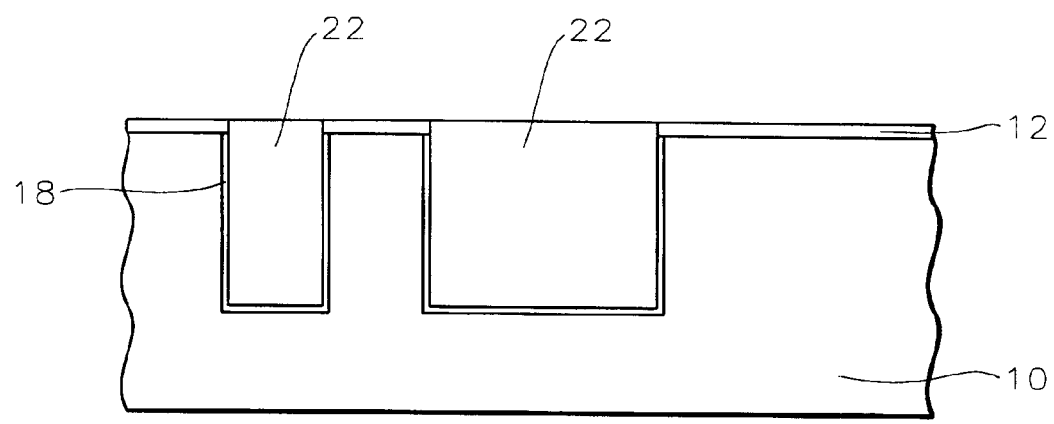

Now the exposed oxide 20 on top of the active areas is removed, as shown in FIG. 13. Referring now to FIG. 14, the etch stop layers 24 and 14 are removed by stripping with phosphoric acid, for example.

FIG. 14 illustrates the final planarity of the shallow trench isolation regions 20, showing good global uniformity without dishing. Significantly, this good global planarity was achieved without chemical mechanical polishing, thus saving many cleaning process steps and saving costs. The planarity is better in this second embodiment even than in the first embodiment because the nitride layer prevents any dishing.

This completes fabrication of the shallow trench isolation regions. The shallow trench isolation has been formed without dishing and without CMP and the subsequent cleaning steps.

While the invention has been particularly shown and described with reference to the preferred embodiments thereof, it will be understood by those skilled in the art that various changes in form and details may be made without departing from the spirit and scope of the invention.

What is claimed is:

1. A method of forming shallow trench isolation regions in the manufacture of an integrated circuit device comprising:

depositing an etch stop layer on the surface of a semiconductor substrate;

etching a plurality of isolation trenches through said etch stop layer into said semiconductor substrate whereby narrow active areas and wide active areas of said semiconductor substrate are left between said isolation trenches;

depositing an oxide layer over said etch stop layer and within said isolation trenches using a high density plasma chemical vapor deposition process (HDP-CVD) having a deposition component and a sputtering component wherein after said oxide layer fills said isolation trenches, said deposition component is discontinued while continuing said sputtering component until said oxide layer is at a desired depth in said isolation trenches whereby said oxide layer within said isolation trenches is disconnected from said oxide layer overlying said etch stop layer;

thereafter etching away said oxide layer overlying said etch stop layer in said wide active areas wherein oxide layer residues are left overlying said etch stop layer; and removing said etch stop layer and said oxide residues to complete planarized said shallow trench isolation regions in said manufacture of said integrated circuit device.

2. The method according to claim 1 further comprising growing a pad oxide layer on said semiconductor substrate before said step of depositing said etch stop layer.

3. The method according to claim 1 wherein said etch stop layer comprises silicon nitride and is deposited by chemical vapor deposition to a thickness of between about 1500 and 2500 Angstroms.

4. The method according to claim 1 further comprising growing a liner layer within said isolation trenches before said step of depositing said oxide layer within said isolation trenches.

5. The method according to claim 1 wherein said step of removing said etch stop layer and said oxide residues comprises a hot phosphoric acid ($H_3PO_4$) dip.

6. The method according to claim 1 wherein said step of removing said etch stop layer and said oxide residues comprises:

etching away said oxide residues using an etching recipe selective to oxide with respect to said etch stop layer; and thereafter removing said etch stop layer using a hot phosphoric acid ($H_3PO_4$) dip.

7. The method according to claim 1 further comprising fabricating semiconductor device structures in and on said semiconductor substrate between said isolation trenches.

8. A method of forming shallow trench isolation regions in the manufacture of an integrated circuit device comprising:

growing a pad oxide layer on the surface of a semiconductor substrate;

depositing a first etch stop layer overlying said pad oxide layer;

etching a plurality of isolation trenches through said first etch stop layer and said pad oxide layer into said semiconductor substrate whereby narrow active areas and wide active areas of said semiconductor substrate are left between said isolation trenches;

depositing an oxide layer over said first etch stop layer and within said isolation trenches using a high density plasma chemical vapor deposition process (HDP-CVD) having a deposition component and a sputtering component wherein after said oxide layer fills said isolation trenches, said deposition component is discontinued while continuing said sputtering component until said oxide layer is sputtered back within said isolation trenches to the level of said pad oxide layer;

depositing a second etch stop layer over said oxide layer using a high density plasma chemical vapor deposition process (HDP-CVD) having a deposition component and a sputtering component whereby said second etch stop layer is sputtered away overlying said oxide layer overlying said first etch stop layer in said narrow active areas and whereby said second etch stop layer remains overlying said oxide layer overlying said first etch stop layer in said wide active areas;

thereafter etching away said second etch stop layer overlying said oxide layer in said wide active areas;

thereafter etching away said oxide layer overlying said first etch stop layer in said narrow and said wide active areas; and removing said first and second etch stop layers to complete planarized said shallow trench isolation regions in said manufacture of said integrated circuit device.

9. The method according to claim 8 wherein said first etch stop layer comprises silicon nitride and is deposited by chemical vapor deposition to a thickness of between about 1500 and 2500 Angstroms.

10. The method according to claim 8 further comprising growing a liner layer within said isolation trenches before said step of depositing said oxide layer within said isolation trenches.

11. The method according to claim 8 wherein said step of depositing said oxide layer by HDP-CVD has a deposition to sputter ratio of about 3.6.

12. The method according to claim 8 wherein said step of depositing said second etch stop layer by HDP-CVD has a deposition to sputter ratio of about 2.

13. The method according to claim 8 wherein said second etch stop layer comprises silicon nitride having a thickness of between about 500 and 2000 Angstroms.

14. The method according to claim 8 wherein said step of removing said first and second etch stop layers comprises a hot phosphoric acid ($H_3PO_4$) dip.

15. The method according to claim 8 further comprising fabricating semiconductor device structures in and on said semiconductor substrate between said isolation trenches.

16. A method of forming shallow trench isolation regions whereby a polishing process is not used in the manufacture of an integrated circuit device comprising:

depositing an etch stop layer on the surface of a semiconductor substrate;

etching a plurality of isolation trenches through said etch stop layer into said semiconductor substrate whereby narrow active areas and wide active areas of said semiconductor substrate are left between said isolation trenches;

depositing an oxide layer over said etch stop layer and within said isolation trenches using a high density plasma chemical vapor deposition process (HDP-CVD) having a deposition component and a sputtering component wherein after said oxide layer fills said isolation trenches, said deposition component is discontinued while continuing said sputtering component until said oxide layer is at a desired depth in said isolation trenches whereby said oxide layer within said isolation trenches is disconnected from said oxide layer overlying said etch stop layer;

thereafter etching away said oxide layer overlying said etch stop layer in said wide active areas wherein oxide layer residues are left overlying said etch stop layer; and removing said etch stop layer and said oxide residues without using a polishing process to complete planarized said shallow trench isolation regions in said manufacture of said integrated circuit device.

17. The method according to claim 16 further comprising growing a pad oxide layer on said semiconductor substrate before said step of depositing said etch stop layer.

18. The method according to claim 16 wherein said etch stop layer comprises silicon nitride and is deposited by chemical vapor deposition to a thickness of between about 1500 and 2500 Angstroms.

19. The method according to claim 16 further comprising growing a liner layer within said isolation trenches before said step of depositing said oxide layer within said isolation trenches.

20. The method according to claim 16 wherein said step of removing said etch stop layer and said oxide residues comprises a hot phosphoric acid ($H_3PO_4$) dip.

21. The method according to claim 16 wherein said step of removing said etch stop layer and said oxide residues comprises:

etching away said oxide residues using an etching recipe selective to oxide with respect to said etch stop layer; and thereafter removing said etch stop layer using a hot phosphoric acid ($H_3PO_4$) dip.

22. The method according to claim 16 further comprising fabricating semiconductor device structures in and on said semiconductor substrate between said isolation trenches.

23. A method of forming shallow trench isolation regions whereby a polishing process is not used in the manufacture of an integrated circuit device comprising:

growing a pad oxide layer on the surface of a semiconductor substrate;

depositing a first etch stop layer overlying said pad oxide layer;

etching a plurality of isolation trenches through said first etch stop layer and said pad oxide layer into said semiconductor substrate whereby narrow active areas and wide active areas of said semiconductor substrate are left between said isolation trenches;

depositing an oxide layer over said first etch stop layer and within said isolation trenches using a high density plasma chemical vapor deposition process (HDP-CVD) having a deposition component and a sputtering component wherein after said oxide layer fills said isolation trenches, said deposition component is discontinued while continuing said sputtering component until said oxide layer is sputtered back within said isolation trenches to the level of said pad oxide layer;

depositing a second etch stop layer over said oxide layer using a high density plasma chemical vapor deposition process (HDP-CVD) having a deposition component and a sputtering component whereby said second etch stop layer is sputtered away overlying said oxide layer overlying said first etch stop layer in said narrow active areas and whereby said second etch stop layer remains overlying said oxide layer overlying said first etch stop layer in said wide active areas;

thereafter etching away said second etch stop layer overlying said oxide layer in said wide active areas;

thereafter etching away said oxide layer overlying said first etch stop layer in said narrow and said wide active areas; and removing said first and second etch stop layers without using a polishing process to complete planarized said shallow trench isolation regions in said manufacture of said integrated circuit device.

24. The method according to claim 23 further comprising growing a liner layer within said isolation trenches before said step of depositing said oxide layer within said isolation trenches.

25. The method according to claim 23 wherein said step of removing said first and second etch stop layers comprises a hot phosphoric acid ($H_3PO_4$) dip.

* * * * *